(12) United States Patent
Jeong et al.

(10) Patent No.: US 10,893,619 B2
(45) Date of Patent: Jan. 12, 2021

(54) BACKLIGHT UNIT AND DISPLAY DEVICE INCLUDING THE SAME

(71) Applicant: SAMSUNG DISPLAY CO., LTD., Yongin-si (KR)

(72) Inventors: Wee Joon Jeong, Seongnam-si (KR); Min Gwan Hyun, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 12 days.

(21) Appl. No.: 16/217,132

(22) Filed: Dec. 12, 2018

(65) Prior Publication Data

US 2019/0182970 A1   Jun. 13, 2019

(30) Foreign Application Priority Data

Dec. 12, 2017   (KR) .......................... 10-2017-0170166

(51) Int. Cl.
| | | |
|---|---|---|
| *H05K 5/00* | (2006.01) | |
| *F21V 8/00* | (2006.01) | |
| *G02F 1/13357* | (2006.01) | |
| *H05K 1/02* | (2006.01) | |
| *G02F 1/1333* | (2006.01) | |
| *H05K 1/18* | (2006.01) | |

(52) U.S. Cl.
CPC ......... *H05K 5/0017* (2013.01); *G02B 6/0045* (2013.01); *G02F 1/133308* (2013.01); *G02F 1/133602* (2013.01); *H05K 1/0274* (2013.01); *H05K 1/189* (2013.01); *H05K 1/0209* (2013.01); *H05K 2201/066* (2013.01); *H05K 2201/10106* (2013.01); *H05K 2201/2009* (2013.01)

(58) Field of Classification Search
None
See application file for complete search history.

(56) References Cited

U.S. PATENT DOCUMENTS

| | | | |
|---|---|---|---|
| 9,052,545 B2 | 6/2015 | Son | |
| 9,599,767 B2 | 3/2017 | Chen et al. | |
| 9,763,346 B2* | 9/2017 | Li | ........................ H05K 5/0017 |
| 10,165,697 B2* | 12/2018 | Kim | ..................... H05K 5/0017 |
| 2011/0069055 A1* | 3/2011 | Jung | ........................ H04N 5/64 345/211 |
| 2014/0268584 A1* | 9/2014 | Song | ........................ H05K 7/02 361/728 |
| 2015/0130775 A1* | 5/2015 | Kim | ........................ H04N 5/64 345/205 |
| 2016/0054512 A1* | 2/2016 | Zhou | .................... G02B 6/0068 362/613 |
| 2016/0187573 A1* | 6/2016 | Kim | ..................... G02B 6/0088 362/606 |
| 2016/0192519 A1* | 6/2016 | Song | ...................... F16M 11/00 361/679.01 |
| 2016/0295711 A1* | 10/2016 | Ryu | ........................ G09F 9/301 |

FOREIGN PATENT DOCUMENTS

| | | |
|---|---|---|
| KR | 10-2012-0126823 | 11/2012 |
| KR | 10-2016-0034510 | 3/2016 |
| KR | 10-2016-0044073 | 4/2016 |

* cited by examiner

*Primary Examiner* — Xanthia C Cunningham
(74) *Attorney, Agent, or Firm* — F. Chau & Associates, LLC

(57) ABSTRACT

A backlight unit includes a light guide plate having a curved surface, and a light source unit disposed at one side of the light guide plate and bent to correspond to the curved surface. The light source unit includes a printed circuit board and a plurality of light sources mounted on the printed circuit board.

23 Claims, 7 Drawing Sheets

BACKLIGHT UNIT AND DISPLAY DEVICE INCLUDING THE SAME

CROSS-REFERENCE TO RELATED APPLICATION

This application claims priority under 35 U.S.C. § 119 to Korean Patent Application No. 10-2017-0170166 filed on the Dec. 12, 2017 in the Korean Intellectual Property Office, the disclosure of which is incorporated by reference herein in its entirety.

TECHNICAL FIELD

The present invention relates to a display device, and more particularly, to a backlight unit and a display device including the backlight unit.

DISCUSSION OF THE RELATED ART

Liquid crystal display devices are a widely used form of display technology. In a liquid crystal display device, liquid crystals are injected between two glass substrates, a voltage is applied to electrodes through power sources disposed over and under the glass substrates, and light is emitted from an external source and through the liquid crystals by altering an arrangement of the liquid crystals, so as to display information.

Since the liquid crystal display device is a light-receiving device that cannot emit light by itself and displays an image by controlling the transmittance of light coming from the outside, a separate device for applying light to the display panel is required. For example, a backlight unit may be used in the display device. Some backlight units include a light source and a light guide plate. The light guide plate receives light from the light source and guides the traveling direction of the light toward a display panel.

As liquid crystal display devices become larger in size, a visual difference between viewing the central portion of a screen and viewing both left and right sides of the screen increases.

Recently, methods of curving a screen of a liquid crystal display device with respect to a central portion have been under development to reduce the visual difference.

SUMMARY

According to an exemplary embodiment of the present invention, a backlight unit includes a light guide plate having a curved surface, and a light source unit disposed at one side of the light guide plate and bent to correspond to the curved surface. The light source unit includes a printed circuit board and a plurality of light sources mounted on the printed circuit board.

According to an exemplary embodiment of the present invention, a display device including a curved display panel, and a backlight unit including a light guide plate disposed under the display panel and curved with a first curvature, and a light source unit disposed at one side of the light guide plate and curved with a second curvature. The light source unit includes a printed circuit board and a plurality of light sources mounted on the printed circuit board, and the printed circuit board includes a first layer and a second layer disposed on the first layer and having a lower flexibility than that of the first layer.

According to an exemplary embodiment of the present invention, a backlight unit including a light guide plate including a surface with a first curvature, and a light source unit disposed at the surface with the first curvature of the light guide plate. The light source unit is flexible and includes a printed circuit board and a plurality of light sources disposed on the printed circuit board. The printed circuit board includes a first layer, a second layer disposed on the first layer, and a third layer disposed on the second layer. A shape of the third layer is different from a shape of the second layer.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
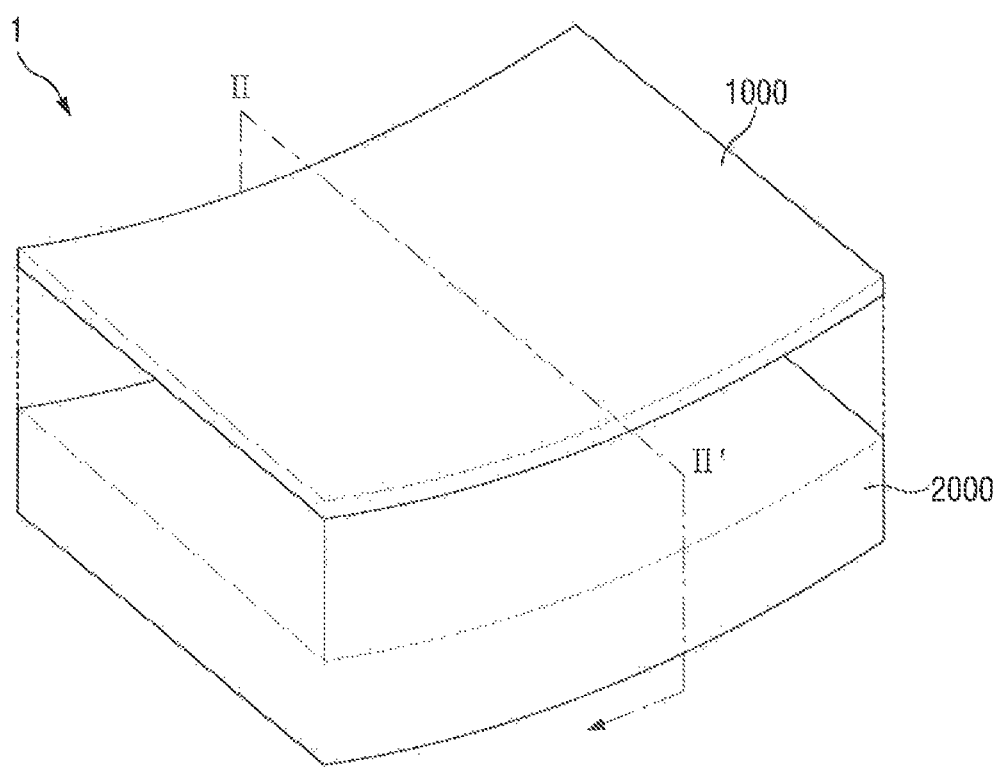
FIG. 1 is a schematic perspective view of a display device according to an exemplary embodiment of the present invention.

Hereinafter, exemplary embodiments of the present invention will now be described in more detail below with reference to the accompanying drawings. Unless otherwise noted, like reference numerals may indicate like elements throughout the attached drawings and the written description, and thus, descriptions thereof may not be repeated. In the drawings, the thickness and sizes of elements, layers, and regions may be exaggerated for clarity.

Figure 2:
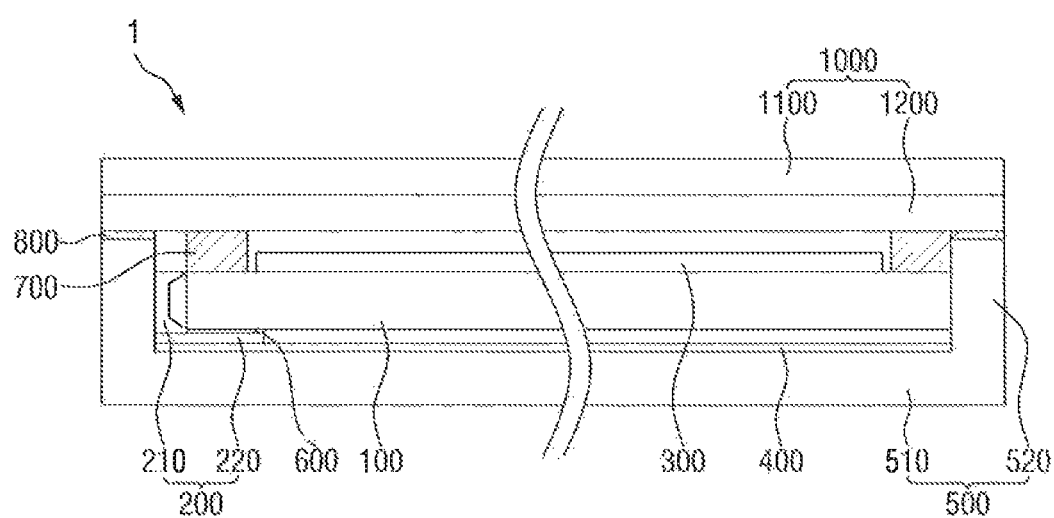
FIG. 2 is a cross-sectional view taken along the line II-II' of FIG. 1 according to an exemplary embodiment of the present invention.
Figure 3:
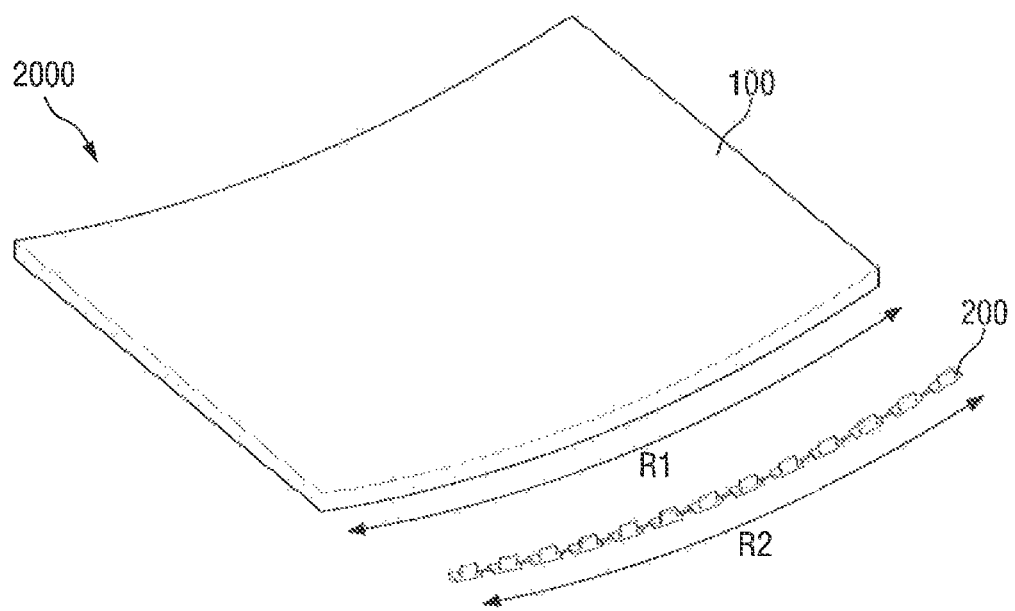
FIG. 3 is an exploded perspective view schematically illustrating a light guide plate and a light source of a backlight unit according to an exemplary embodiment of the present invention.

It will be understood that when a layer, area, element, or plate is referred to as being "on," "connected to," or "coupled to" another layer, area, or plate, it may be directly on, connected, or coupled to the other layer, area, element, or plate, or intervening layers, areas, elements, or plates may be present therebetween. FIG. 1 is a schematic perspective view of a display device according to an exemplary embodiment of the present invention. FIG. 2 is a cross-sectional view taken along the line II-II' of FIG. 1 according to an exemplary embodiment of the present invention. FIG. 3 is an exploded perspective view schematically illustrating a light guide plate and a light source of a backlight unit according to an exemplary embodiment of the present invention.

Referring to FIGS. 1 to 3, a display device 1 includes a display panel 1000 and a backlight unit 2000 disposed under the display panel 1000. The term "upper" or "upper surface" may refer to a side of a display surface with respect to the display panel 1000, and the term "lower" or "lower surface" may refer to a side opposite to the display surface with respect to the display panel 1000.

The display device 1 may be a curved display device. The display device 1 may have a curved shape with a single curvature, or may have a curved shape with multiple curvatures. However, the present invention is not limited thereto, and the display device 1 may be a flat panel display device, or may be a flexible display device that can be variously and freely bent.

The display panel 1000 is a panel for displaying an image, and may be, for example, a liquid crystal display panel. Throughout the specification, as an example, the liquid crystal display panel will be used in the display device 1. However, the present invention not limited thereto, and other types of display panels, such as an electro wetting display panel, an electrophoretic display panel, and a micro electro mechanical system display panel, may be used.

The display panel 1000 includes a first display substrate 1100, a second display substrate 1200 facing the first display substrate 1100, and a liquid crystal layer disposed between the first display substrate 1100 and the second display substrate 1200. The first display substrate 1100 and the second display substrate 1200 overlap each other. In an exemplary embodiment of the present invention, one substrate may be larger than the other substrate, and thus may further protrude outward. The protruding region may provide a space for mounting a drive chip or an external circuit board. For example, the side surfaces of the first display substrate 1100, excluding the protruding region in the display panel 1000, may be substantially aligned with the side surfaces of the second display substrate 1200. As an additional example, side surfaces of the first display substrate 1100 and side surfaces of the second display substrate 1200 may be coplanar.

The backlight unit 2000 is disposed on the display panel 1000. For example, the backlight unit 2000 may be disposed on the display panel 1000. The backlight unit 2000 provides light to the display panel 1000. In other words, the display panel 1000 receives light from the backlight unit 2000 and displays an image.

The backlight unit 2000 includes a light guide plate 100 and a light source unit 200. The backlight unit 2000 may further include an optical sheet 300 and a reflective member 400.

The light guide plate 100 may guide the travelling path of light. The light guide plate 100 may have a substantially polygonal columnar shape. The planar shape of the light guide plate 100 may be rectangular, but the present invention is not limited thereto. In an exemplary embodiment of the present invention, the light guide plate 100 has a rectangular parallelepiped shape whose planar shape is rectangular, and may include an upper surface, a lower surface, and four side surfaces.

The light guide plate 100 may be formed in a shape corresponding to that of the display panel 1000. The light guide plate 100 may have a uniform thickness, and may include a curved surface. For example, the thickness of the light guide plate 100 may be uniform throughout its entirety. In an exemplary embodiment of the present invention, the light guide plate 100 may be formed to have the same curvature as the display panel 1000. For example, the light guide plate 100 may be curved along both of its long sides. However, the present invention is not limited thereto, and the light guide plate 100 may be curved along both of its short sides.

The light guide plate 100 may include an inorganic material. For example, the light guide plate 100 may be made of glass, but the present invention is not limited thereto, and may include a polymer material such as polyethylene terephthalate (PET), polymethyl methacrylate (PMMA), or poly carbonate (PC).

The light source unit 200 is disposed at one side of the light guide plate 100. The light source unit 200 may include a plurality of point light source units. Each point light source unit may be a light emitting diode (LED) light source 210. Details of the light source unit 200 will be described with reference to FIG. 4.

Figure 4:
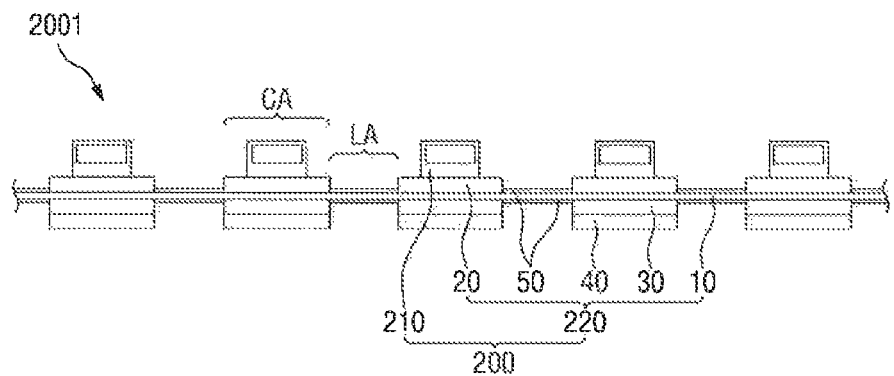
FIG. 4 is a side view of a printed circuit board according to an exemplary embodiment of the present invention.
Figure 4:

FIG. 4 is a side view of a printed circuit board according to an exemplary embodiment of the present invention.

Referring to FIG. 4, the light source unit 200 may include a plurality of light sources 210 and a printed circuit board 220 on which the plurality of light sources 210 are mounted. The printed circuit board 220 includes first areas CA, in each of which a light source 210 is disposed and a circuit for driving the light source 210 is formed, and second areas LA, each of which is a space between adjacent light sources 210 and connects the first areas CA to each other.

The plurality of light sources 210 may be disposed on the printed circuit board 220 and may be spaced apart from each other. Although it is shown in FIG. 4 that each of the light sources 210 is disposed with a uniform spacing between each other, the present invention is not limited thereto. For example, the spacing distances among the light sources 210 may be changed to selectively irradiate a specific region with a large amount of light.

The LED light source 210 may be an R, G, or B LED that emits red, green, or blue monochromatic light, or may be a W-LED that emits white light. When the LED light source 210 emitting monochromatic light is used, monochromatic LED light sources 210 of R, G, and B are alternately arranged at regular intervals, monochromatic light emitted from the monochromatic LED light sources 210 is mixed into white light, and the white light is supplied to the display panel 1000. Unlike this, when the LED light source 210 emitting white light is used, the plurality of LED light sources 210 may be arranged at regular intervals to supply white light to the display panel 1000.

For example, the LED light source 210 may be a side view type LED light source that emits light to a side surface, or may be a side mount top view type LED light source that emits light to an upper surface.

The printed circuit board 220 may be formed of a plurality of layers. For example, the printed circuit board 220 may include a first layer 10, a second layer 20, a third layer 30, and a fourth layer 40. However, the present invention is not limited thereto, and the printed circuit board 220 may be formed of one to three layers, or may include five layers or more.

The first layer 10 may be formed as a central layer of the printed circuit board 220, and a conductor pattern may be formed on the first layer 10. The first layer 10 may include a material having flexibility, and can exhibit flexible properties. For example, the first layer 10 may include copper (Cu).

The second layer 20 may be disposed on the upper surface of the first layer 10, and the third layer 30 may be disposed on the lower surface of the first layer 10. For example, the first layer 10 and the second layer 20 may be formed at the same time, and any one layer may be omitted.

The second layer 20 and the third layer 30 may be insulating layers, and can protect the first layer 10 and prevent the oxidation of the conductor pattern. The second layer 20 and the third layer 30 may exhibit rigid properties because they may include a material having a low flexibility and a high rigidity. For example, the second layer 20 and the third layer 30 may include polyimide (PI), polyethylene terephthalate (PET), or the like.

The fourth layer 40 may be disposed on the lower surface of the third layer 30. The fourth layer 40 may be a metal layer formed of a metal having heat transfer properties. For example, the fourth layer 40 may include aluminum (Al). The fourth layer 40 may dissipate the heat generated by the operation of the light source 210 and the printed circuit board 220 to the outside, thereby preventing the deterioration of the light source unit 200.

The first layer 10 may extend continuously without disconnected regions, and may connect all the light sources 210 together. For example, the first layer 10 may extend through all of the light sources 210. Unlike the continuous first layer 10, each of the second to fourth layers 20, 30, and 40 may be disposed discontinuously. For example, the second layer 20, the third layer 30, and the fourth layer 40 may overlap the first area CA in which the light source 210 is disposed, and may not be disposed in the second area LA in which the light source 210 is not disposed. As an additional example, the side surfaces of the second to fourth layers 20, 30, and 40 may be aligned with each other.

The upper and lower surfaces of the first layer 10 may be exposed through the space in which the second to fourth layers 20, 30 and 40 are not disposed. For example, the first layer 10 is exposed in the second area LA. As described above, since the first layer 10 includes a material having a higher flexibility than that of the second layer 20 and the third layer 30, the second area LA composed only of the first layer 10 has a higher flexibility than that of the first area CA in which the second layer 20 and the third layer 30 are disposed. For example, the first areas CA of the printed circuit board 220, in which the light sources 210 are disposed, has rigid properties, and the second area LA between the first areas CA has flexible properties, so that the light source unit 200 may have both rigid properties and flexible properties. The light source unit 200 may be disposed to have various curvatures R2 by bending the printed circuit board 220 along the flexible second area LA. In other words, the light source unit 200 is not limited to a specific curvature, and may be disposed to have various curvatures according to use or an applied force.

A protective layer 50 may be disposed in an exposed area of the first layer 10. For example, the protective layer 50 may not be disposed on the second to fourth layers 20, 30 and 40. As an additional example, the protective layer 50 may be disposed in the second area LA. The protective layer 50 may prevent exposed areas of the first layer 10 from being corroded or contaminated by external foreign matter. In addition, the protective layer 50 may prevent the first layer 10 from being disconnected or broken, thereby increasing the durability of the first layer 10.

In an exemplary embodiment of the present invention, the second to fourth layers 20, 30, and 40 may be disposed on the first area CA of the first layer 10 after being patterned, respectively. In an exemplary embodiment of the present invention, the second to fourth layers 20, 30, 40 may be formed on the entire surface of the first layer 10, patterned and then removed from the surface of the first layer 10.

Referring to FIGS. 1 to 3 again, the light source unit 200 may be disposed on one side of the curved area of the light guide plate 100. For example, the light source unit 200 may be disposed on the side surface of one long side of the light guide plate 100 having a curved shape. However, the present invention is not limited thereto, and the light source unit 200 may be disposed on the side surfaces of both long sides of the light guide plate 100, or may be disposed on the side surface of one short side or the side surfaces of both short sides of the light guide plate 100, the one short side or the both shorts side not being a curved area. In this embodiment, the side surface of one long side of the light guide plate 100 on which the light source unit 200 is disposed is a light incidence surface on which the light of the light source unit 200 is directly incident, and the side surface of the opposite long side facing the one long side is a light facing surface.

Since the light source unit 200 includes the second area LA having flexibility as described above, the light source unit 200 may be bent to correspond to the curvature of the side surface of the light guide plate 100. In an exemplary embodiment of the present invention, when the light guide plate 100 is disposed with the first curvature R1 and the light source unit 200 is disposed with the second curvature R2, the first curvature R1 and the second curvature R2 may be the same. The first curvature R1 may be a single curvature value, or may include a plurality of curvature values.

The light guide plate 100 and the light source unit 200 are disposed such that the curvature R1 of the light guide plate 100 is the same as the curvature R2 of the light source unit 200, thereby narrowing the interval between the light guide plate 100 and the light source unit 200 and overcoming a light leakage phenomenon. In other words, when the curvature R1 of the light guide plate 100 is different from the curvature R2 of the light source unit 200, the light guide plate 100 may be in contact with the light source unit 200 in one area and not other areas. For example, the light source unit 200 may be in contact with only one area of the light guide plate 100, and a gap may be formed between the light guide plate 100 and the light source unit 200 in other areas. As an additional example, when the central portion of the light guide plate 100 is in contact with the light source unit 200, both side portions of the light incident surface of the light guide plate 100 do not overlap the light source unit 200. In this case, the light emitted from the light source unit 200 leaks to the outside without being incident on the light guide plate 100, and the emitted light is visually recognized as light leakage in the display panel 1000, thereby decreasing light incidence efficiency. In addition, when the light guide plate 100 and the light source unit 200 are disposed with the same curvature, the gap between light guide plate 100 and the light source unit 200 may be reduced, so that most of the light emitted from the light source unit 200 may be incident on the light guide plate 100. As a result, the light leakage phenomenon may be reduced, and the light incident efficiency can increase.

The light guide plate 100 and the light source unit 200 are disposed such that the curvature R1 of the light guide plate 100 is the same as the curvature R2 of the light source unit 200 and such that the light source 210 of the light source unit 200 is in contact with the light incidence surface of the light guide plate 100, thereby increasing the light incident efficiency and overcoming the light leakage phenomenon.

The light source unit 200 may be stably fixed by attaching the printed circuit board 220 to the lower surface of the light guide plate 100. A member 600 may be disposed between the printed circuit board 220 and the light guide plate 100 to connect the light source unit 200 and the light guide plate 100.

The adhesive member 600 may be made of an adhesive material. For example, the adhesive member 600 may be a double-sided tape. As another example, the adhesive member 600 may be made of a material having a high thermal conductivity. When the thermal conductivity of the adhesive member 600 is high, heat generated from the light source unit 200 may be emitted to the outside through the light guide plate 100. For example, since the light guide plate 100 made of glass has high thermal conductivity, the heat generated from the light source unit 200 may be diffused through the light guide plate 100 to prevent the deterioration of the light source unit 200.

The refractive index of the adhesive member 600 may be equal to or lower than the refractive index of the light guide plate 100. For effective total reflection inside the light guide plate 100, an effective optical interface may be formed on the upper and lower surfaces of the light guide plate 100. Generally, as the refractive index of a medium forming an optical interface with the light guide plate 100 is lowered, a total reflection critical angle may decrease, and thus, internal total reflection may frequently occur. For example, when the light guide plate 100 is made of glass having a refractive index of about 1.5, the refractive index of the adhesive member 600 may be less than about 1.5.

The backlight unit 2000 may further include an optical sheet 300 disposed on the light guide plate 100 and a reflective member 400 disposed under the light guide plate 100. In other words, the light guide plate 100 is disposed between the optical sheet 300 and the reflective member 400.

The optical sheet 300 includes at least one optical function sheet. For example, the optical sheet 300 may be a prism sheet, a spread sheet, a microlens sheet, a lenticular sheet, a polarizing sheet, a reflective polarizing sheet, a phase difference sheet, or the like. The optical sheet 300 may include the same type or different types of optical functional sheets.

The reflective member 400 may include a reflective film or a reflective coating layer. The reflective member 400 may reflect the light emitted to the lower surface of the light guide plate 100 and may allow the reflected light to enter the light guide plate 100 again.

The display panel 1000 and the light guide plate 100 may be coupled to each other by an inter-module coupling member 700. The inter-module coupling member 700 may have a rectangular frame shape in a plane view. The inter-module coupling member 700 may be located at the edges of the display panel 1000 and the light guide plate 100.

The inter-module coupling member 700 may include a polymer resin, an adhesive tape, or the like. In an exemplary embodiment of the present invention, the inter-module coupling member 700 may further perform a light transmission blocking function. For example, the inter-module coupling member 700 may include a light absorbing material such as a black pigment or dye, or may include a reflective material, thereby performing a light transmission blocking function.

The display device 1 may further include a housing 500. The housing 500 is open at one side, and includes a bottom portion 510 and a side wall 520 connected to the bottom portion 510. The light guide plate 100, the light source unit 200, the reflective member 400, and the like may be disposed in the housing 500. The light guide plate 100, the light source unit 200, the reflective member 400, and the like are disposed on the bottom portion 510 of the housing 500. The display panel 1000 is disposed adjacent to the upper end of the side wall 520 of the housing 500, and they may be coupled to each other by a housing coupling member 800. The housing coupling member 800 may have a rectangular frame shape in a plane view, and may include a polymer resin, an adhesive tape, or the like.

Hereinafter, according to exemplary embodiments of the present invention, the light source unit will be described. In the following exemplary embodiments of the present invention, a description of substantially the same configuration and elements as that of the previously described embodiment may be omitted or simplified, and differences will be mainly described.

FIGS. 5, 6, 7, 8, 9 and 10 are side views of light source units according to exemplary embodiments of the present invention. Exemplary embodiments of the present invention of FIGS. 5 to 10 illustrate that the shape of the printed circuit board of the light source unit can be variously modified.

Figure 5:
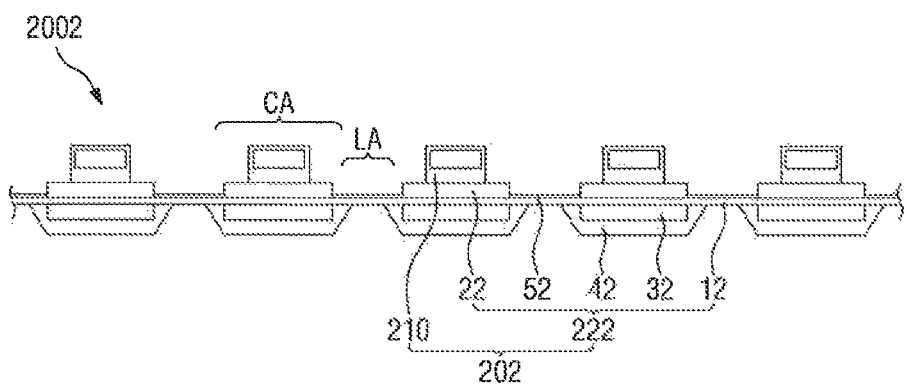
FIGS. 5, 6, 7, 8, 9 and 10 are side views of light source units according exemplary embodiments of the present invention.
Figure 5:

FIG. 5 illustrates that, in the light source unit 202 of the backlight unit 2002, the side surface of the fourth layer 42 included in the printed circuit board 222 is disposed to be inclined with respect to the first layer 12. In other words, the side surface of the fourth layer 42 is disposed at a predetermined angle with respect to the first layer 12. For example, the fourth layer 42 may have a tapered shape.

The side surface of the fourth layer 42 protrudes beyond the side surface of the third layer 32 to cover the side surface of the third layer 32. The distance between the third layers 32 may be smaller than the distance between the fourth layers 42.

When each of the side surfaces of the third layer 32 and the fourth layer 42 is disposed in a direction perpendicular to the first layer 12, a relatively large step is formed at an area where side surfaces of the third layer 32 and the fourth layer 42 meet the first layer 12, for example, at boundary between the first area CA and the second area LA, and it may be vulnerable to an external impact. In this case, the third layer 32 and/or the fourth layer 42 may be easily stripped by an external force such as bending the printed circuit board 222. On the other hand, when the side surface of the third layer 32 is protected by the fourth layer 42 and the step of the boundary between the first region CA and the second region LA is reduced, the risk of stripping the fourth layer 42 can be reduced, and the durability against an external impact can increase.

Since a part of the lower surface of the first layer 12 in the second area LA is protected by the fourth layer 42, the protective layer 52 formed on the lower surface of the first layer 12 may be omitted.

Figure 6:
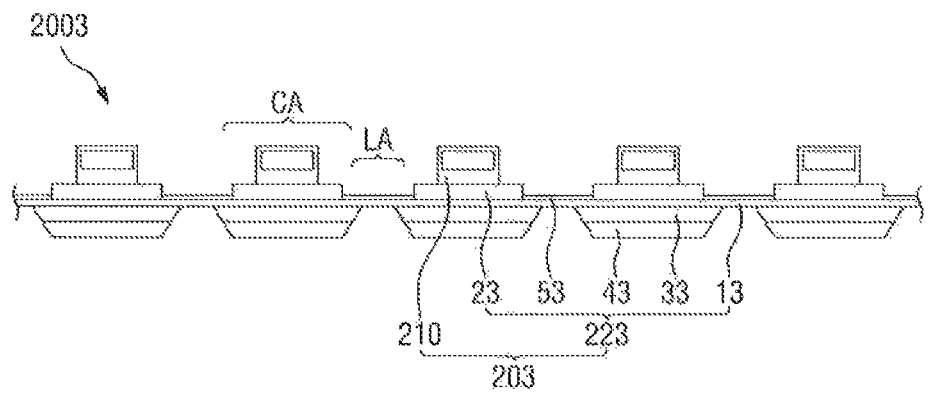
Figure 6:

Referring to FIG. 6, in the light source unit 203 of the backlight unit 2003, the printed circuit board 223 may include the third layer 33 and the fourth layer 43, which are disposed to be inclined with respect to the first layer 13. For example, the third layer 33 and the fourth layer 43 may each have a tapered shape.

The side surface of the third layer 33 may be disposed on the same plane as the side surface of the fourth layer 43, and may be disposed to be inclined with respect to the first layer 13. For example, the lateral inclination angle of the side surface of the third layer 33 may be substantially equal to the lateral inclination angle of the side surface of the fourth layer 43. In an exemplary embodiment of the present invention, the side surfaces of the third layer 33 and the fourth layer 43 may be cut simultaneously. Unlike in FIG. 5 in which the third layer 33 and the fourth layer 43 may be formed simultaneously to simplify the process.

When the side surface of the third layer 33 and the side surface of the fourth layer 43 are disposed to be inclined with respect to the first layer 13, as described above, the step at the boundary between the first area CA and the second area LA is reduced, so that the stripping risk may be reduced, and the durability can be increased.

In an exemplary embodiment of the present invention, the third layer 33 may be disposed on the printed circuit board 223 and may have a tapered shape, and the fourth layer 43 may be disposed on the third layer 33 and have a rectangular or square shape. A width of the fourth layer 43 may be less than or equal to a width of the third layer 33.

Figure 7:
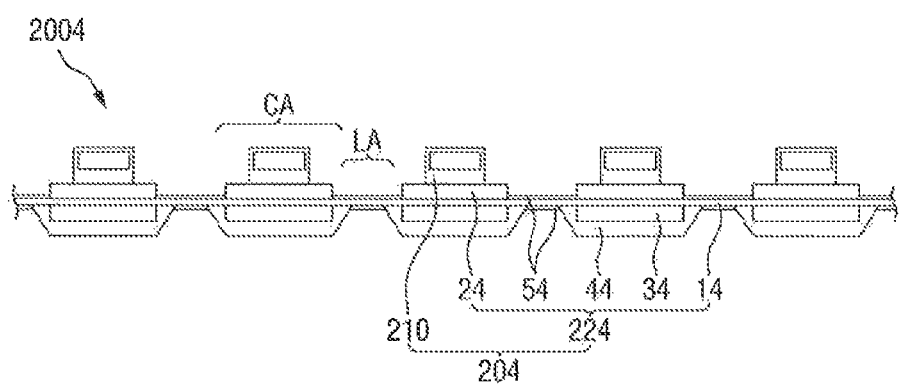
Figure 7:
Figure 8:
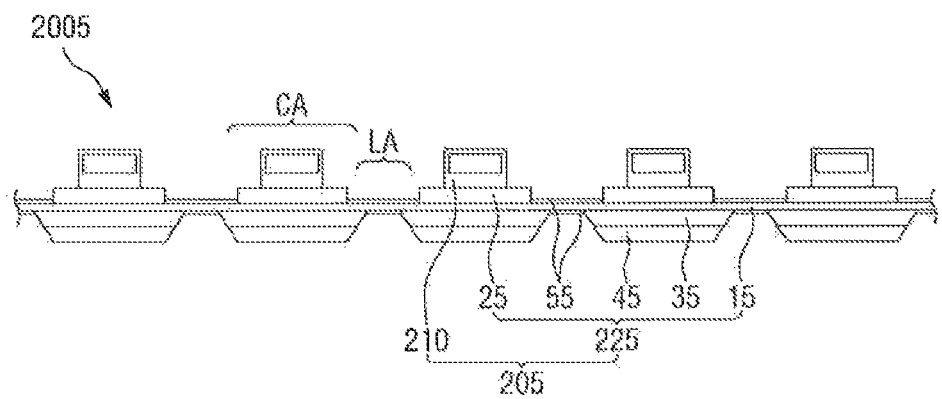
Figure 8:

Referring to FIGS. 7 and 8, the backlight units 2004 and 2005, according to an exemplary embodiment of the present invention, are different from the backlight units 2002 and 2003 shown in FIGS. 5 and 6 in that the light source units 204 and 205 of the backlight units 2004 and 2005 include the protective layers 54 and 55 disposed on the lower surfaces of the first layers 14 and 15, respectively.

Each of the first layers 14 and 15 of the printed circuit boards 224 and 225 may be made of only one layer, and may thus, be easily damaged by an external impact. When the protective layers 54 and 55 are disposed on the upper surfaces as well as the lower surfaces of the first layers 14 and 15 of the printed circuit boards 224 and 225, resistance to external impacts and external contaminants may further increase, so that the durability of the entire printed circuit boards 224 and 225 can increase.

In the backlight units 2002, 2003, 2004 and 2005, in FIGS. 5 to 8, according to an exemplary embodiment of the present invention, the side surfaces of the third layers 32, 33, 34 and 35 and/or the fourth layers 42, 43, 44 and 45 are disposed on one plane. However, the present invention is not limited thereto, and the side surfaces thereof may be curved surfaces.

Figure 9:
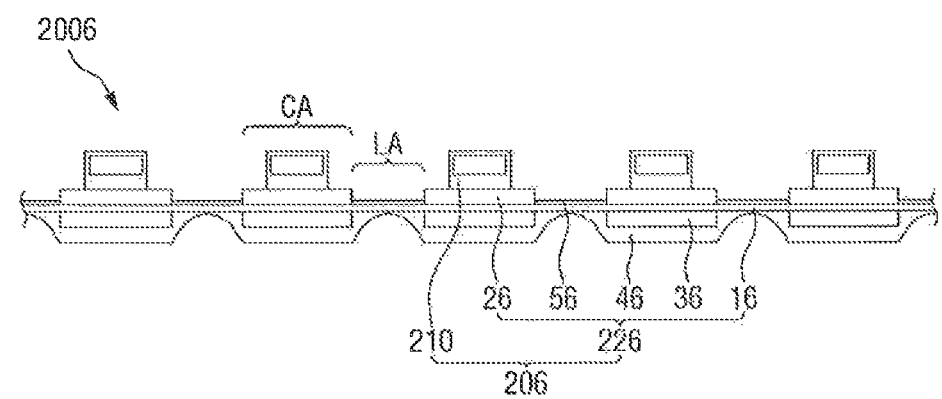
Figure 9:

FIG. 9 is different from FIG. 4 in that, in the light source unit 206 of the backlight unit 2006, the fourth layer 46 included in the printed circuit board 226, similarly to the first layer 16, continuously extends and is a single body.

The fourth layer 46 may be disposed in the second area LA as well as the first area CA, and the lower surface of the fourth layer 46 in the second area LA may be formed in an arch shape. The fourth layer 46 covers the side surface of the third layer 36.

The thickness of the fourth layer 46 may be different for each area. In other words, the thickness of the fourth layer 46 in the first area CA may be greater than the thickness of the fourth layer 46 in the second area LA.

In general, flexibility increases as the thickness of a member decreases, and the flexibility of the second area LA can be maintained by decreasing the thickness of the fourth layer 46 in the second area LA. In other words, when the second area LA of the printed circuit board 226 is bent, the fourth layer 46 disposed under the first layer 16 undergoes tensile stress, and, in this case, the tensile stress may be reduced by decreasing the thickness of the fourth layer 46 in the second area LA.

Since the fourth layer 46 functions to protect the first layer 16, the protective layer 56 on the lower surface of the first layer 16 may be omitted.

Figure 10:
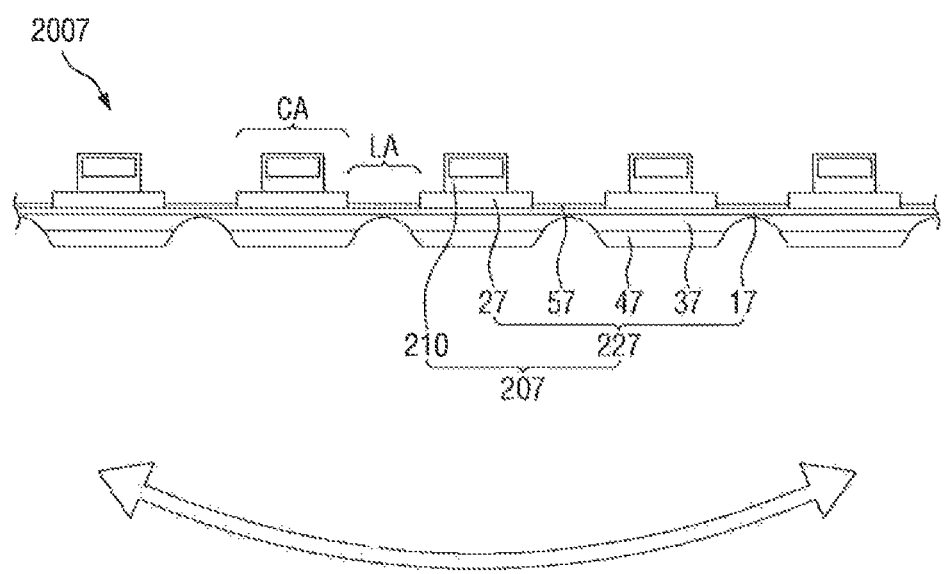

Referring to FIG. 10, the backlight unit 2007, according to an exemplary embodiment of the present invention, is different from the backlight unit 2006 shown in FIG. 9 in that, in the light source unit 207 of the backlight unit 2007, the printed circuit board 227 includes a third layer 37 that is continuous and a single body.

The third layer 37 may be disposed in the second area LA as well as the first area CA. The lower surface of the third layer 37 in the second area LA may be formed in an arch shape. The side surfaces of the third layer 37 and the fourth layer 47 may be continuous and aligned with each other. For example, the side surfaces of the third layer 37 and the fourth layer 47 may be coplanar.

The thickness of the third layer 37 may be different for each area. As described above, the flexibility in the second area LA can be maintained by reducing the thickness of the third layer 37 in the second area LA.

Unlike previous exemplary embodiments of the present invention, a process can be simplified in that the third layer 37 and the fourth layer 47 can be removed simultaneously in the second area LA.

As described above, according to an exemplary embodiment of the present invention, in a backlight unit, a light source can be disposed on a light guide plate to have the same curvature as the light guide plate. Further, the distance between the light incidence surface of the light guide plate and the light source can be disposed to have a zero gap, and the light incident efficiency of the backlight unit can be increased.

Further, in a display device according to an exemplary embodiment of the present invention, the light leakage phenomenon on a display screen can be overcome.

While the present invention has been particularly shown and described with reference to exemplary embodiments thereof, it will be apparent to those of ordinary skill in the art that various changes in form and detail may be made thereto without departing from the spirit and scope of the present invention as defined by the following claims.

What is claimed is:

1. A backlight unit, comprising:
a light guide plate having a curved surface; and
a light source unit disposed at one side of the light guide plate and bent to correspond to the curved surface,
wherein the light source unit includes a printed circuit board and a plurality of light sources mounted on the printed circuit board,
wherein the printed circuit board includes a plurality of first areas and a second area disposed between adjacent first areas, wherein the plurality of light sources is arranged on the plurality of first areas, and
wherein the second area is more flexible than the first areas.

2. A backlight unit, comprising:
a light guide plate having a curved surface; and
a light source unit disposed at one side of the light guide plate and bent to correspond to the curved surface,
wherein the light source unit includes a printed circuit board and a plurality of light sources mounted on the printed circuit board,
wherein the printed circuit board includes a plurality of first areas and a second area disposed between adjacent first areas, wherein the plurality of light sources is arranged on the plurality of first areas, and
wherein the printed circuit board includes a first layer disposed on the plurality of first areas and the second area, and a second layer disposed on the first layer and disposed in the plurality of first areas and not the second area.

3. The backlight unit of claim 2,
wherein the first layer has a higher flexibility than that of the second layer.

4. The backlight unit of claim 2, further comprising:
a protective layer disposed on the first layer exposed by the second layer.

5. The backlight unit of claim 2,
wherein a side surface of the second layer has a predetermined angle with respect to the first layer.

6. The backlight unit of claim 2,
wherein a side surface of the second layer includes a curved surface.

7. The backlight unit of claim 2,
wherein the printed circuit board includes a third layer disposed on the second layer and disposed in the plurality of first areas and not the second area, and a side surface of the third layer is aligned with a side surface of the second layer.

8. The backlight unit of claim 7,
wherein the third layer has a higher thermal conductivity than that of the second layer.

9. A display device, comprising:
a curved display panel; and a backlight unit including a light guide plate disposed under the display panel and curved with a first curvature, and a light source unit disposed at one side of the light guide plate and curved with a second curvature, wherein the light source unit includes a printed circuit board and a plurality of light sources mounted on the printed circuit board, and the printed circuit board includes a first layer and a second layer disposed on the first layer and having a lower flexibility than that of the first layer.

10. The display device of claim 9,
wherein the first curvature is equal to the second curvature.

11. The display device of claim 9,
wherein the light source unit is in contact with the light guide plate.

12. The display device of claim 11,
wherein the printed circuit board is fixed to a lower surface of the light guide plate.

13. The display device of claim 12, further comprising:
an adhesive member disposed between the printed circuit board and the lower surface of the light guide plate.

14. The display device of claim 9,
wherein the adhesive member has thermal conductivity.

15. The display device of claim 9,
wherein the printed circuit board includes a plurality of first areas and a second area disposed between adjacent first areas and connected to the adjacent first areas, wherein the plurality of light sources is arranged on the plurality of first areas.

16. The display device of claim 15,
wherein the first layer is disposed on the plurality of first areas and the second area, and the second layer is disposed in the plurality of first areas and not the second area.

17. The display device of claim 16,
wherein the printed circuit board includes a third layer disposed on the second layer, and the third layer is disposed in the plurality of first areas and not the second area.

18. The display device of claim 17, further comprising:
a protective layer disposed on the first layer exposed by the second layer and the third layer.

19. The display device of claim 15,
wherein the second layer is disposed in the plurality of first areas and the second area, and a thickness of the second layer in the second area is thinner than a thickness of the second layer in the plurality of first areas.

20. The display device of claim 9, wherein the first layer is a single body.

21. A backlight unit, comprising:
a light guide plate including a surface with a first curvature; and
a light source unit disposed at the surface with the first curvature of the light guide plate, wherein the light source unit is flexible and includes a printed circuit board and a plurality of light sources disposed on the printed circuit board, wherein the printed circuit board includes a first layer, a second layer disposed on the first layer, and a third layer disposed on the second layer, wherein a shape of the third layer is different from a shape of the second layer.

22. The backlight unit of claim 21, wherein the third layer covers a lower surface and side surfaces of the second layer.

23. The backlight unit of claim 21, wherein the printed circuit board is disposed on a lower surface of the light guide plate, and the plurality of light sources is not disposed on the lower surface of the light guide plate.

* * * * *